(12) United States Patent
Mashiko et al.

(10) Patent No.: US 6,836,071 B2
(45) Date of Patent: Dec. 28, 2004

(54) MEMBER FOR ELECTROLUMINESCENT DEVICE CONTAINING REMOVING AGENT AND ELECTROLUMINESCENT DEVICE CONTAINING THE SAME

(75) Inventors: Hiroaki Mashiko, Osaka (JP); Hiroyuki Nishii, Osaka (JP)

(73) Assignee: Nitto Denko Corporation, Osaka (JP)

(*) Notice: Subject to any disclaimer, the term of this patent is extended or adjusted under 35 U.S.C. 154(b) by 0 days.

(21) Appl. No.: 09/818,573

(22) Filed: Mar. 28, 2001

(65) Prior Publication Data

US 2001/0028218 A1 Oct. 11, 2001

(30) Foreign Application Priority Data

Mar. 28, 2000 (JP) .................................. P. 2000-089705
Oct. 31, 2000 (JP) .................................. P. 2000-332499

(51) Int. Cl.[7] ...................... H05B 33/00; H05B 33/04
(52) U.S. Cl. ...................... 313/553; 313/512; 428/690
(58) Field of Search ........................ 313/553, 512, 313/506, 504, 509; 428/917, 690

(56) References Cited

U.S. PATENT DOCUMENTS

| | | | |
|---|---|---|---|
| 4,357,557 A | | 11/1982 | Inohara et al. |
| 5,107,175 A | | 4/1992 | Hirano et al. |
| 5,124,204 A | * | 6/1992 | Yamashita et al. ........ 428/331 |
| 5,444,331 A | * | 8/1995 | Matsuno et al. ........... 313/553 |
| 5,882,761 A | * | 3/1999 | Kawami et al. ............ 428/69 |
| 5,952,778 A | * | 9/1999 | Haskal et al. .............. 313/504 |
| 5,990,615 A | * | 11/1999 | Sakaguchi et al. ......... 313/504 |
| 6,210,815 B1 | * | 4/2001 | Ooishi ........................ 428/690 |
| 6,284,342 B1 | * | 9/2001 | Ebisawa et al. ............ 428/69 |
| 6,551,724 B2 | * | 4/2003 | Ishii et al. .................. 428/690 |
| 6,624,568 B2 | * | 9/2003 | Silvernail .................. 313/504 |
| 6,628,071 B1 | * | 9/2003 | Su ............................. 313/512 |
| 6,635,988 B1 | * | 10/2003 | Izumizawa et al. ........ 313/504 |
| 6,696,179 B2 | * | 2/2004 | Mashiko et al. ............ 428/690 |
| 6,737,176 B1 | * | 5/2004 | Otsuki et al. .............. 428/690 |

FOREIGN PATENT DOCUMENTS

| | | | |
|---|---|---|---|
| CN | 2314546 Y | 4/1999 | |
| EP | 0350907 A2 | 1/1990 | |
| EP | 0405361 A1 | 1/1991 | |
| EP | 1115267 A2 | 7/2001 | |
| EP | 1137325 A2 | 9/2001 | |
| JP | 9-148066 | 6/1997 | ........ H05B/33/04 |
| WO | WO 0119142 A1 | 3/2001 | |

OTHER PUBLICATIONS

XP–002225340, Nitto Denko Corporation, Abstract of JP2001198429, Jul. 24, 2001.
XP–002225341, Nitto Denko Corporation, Abstract of JP2001267063, Sep. 28, 2001.
Chinese Office Action.

* cited by examiner

Primary Examiner—Nimeshkumar D. Patel
Assistant Examiner—Dalei Dong
(74) Attorney, Agent, or Firm—Sughrue Mion, PLLC

(57) ABSTRACT

A member for an electroluminescent device permitting a production cost reduction and an electroluminescent device containing the same. The member for an electroluminescent device contains a removing agent for removing a predetermined gas component and an adhesion member fixed to the removing agent.

9 Claims, 4 Drawing Sheets

MEMBER FOR ELECTROLUMINESCENT DEVICE CONTAINING REMOVING AGENT AND ELECTROLUMINESCENT DEVICE CONTAINING THE SAME

FIELD OF THE INVENTION

The present invention relates to a member for electroluminescent (EL, hereafter) devices for removing a predetermined gas component in an EL device and to an EL device containing the same.

BACKGROUND OF THE INVENTION

EL devices have been conventionally used as a light emitter in a display or a light emitting element of various apparatuses such as mobile apparatuses. However, EL devices have a disadvantage that the luminous performance, such as luminance and luminous uniformity, substantially degrades with aging for certain period of time or under a high temperature. Such degradation in luminous performance has been found to be caused by non-luminous portions (dark spots) formed by the moisture adsorbed on the surface of the components and the constituting materials and by the moisture, oxygen, and organic gases introduced from the outside.

Thus, in order to eliminate the cause of the degradation in luminous performance (occurrence of the dark spots), an EL device has been proposed in JP-A-9-148066 (The term "JP-A" as used herein means an "unexamined published Japanese patent application"). The EL device comprises drying means which chemically adsorbs the moisture and is composed of a compound remaining solid even after the adsorption. The drying means is made by solidifying an appropriate compound and then fixed within the EL device.

However, the above-mentioned EL device needs the process of solidifying the compound for the drying means, and hence requires time and equipment for the solidification. This causes a problem of a higher production cost.

SUMMARY OF THE INVENTION

The present invention has been devised considering such a situation. An object of the present invention is to provide a member for EL devices reducing the cost of EL device production and an EL device containing the same.

In order to achieve the above-mentioned object, a first aspect of the present invention is a member for EL devices, comprising: a removing agent for removing a predetermined gas component; and an adhesion member fixed to the removing agent. And, a second aspect of the present invention is an EL device containing the member for EL devices.

That is, a member for EL devices of the present invention comprises: a removing agent for removing a predetermined gas component; and an adhesion member fixed to the removing agent and for adhering the removing agent onto the inner surface of an EL device. Because of this simple structure comprising a removing agent and an adhesion member, the member for EL devices permits easy fabrication thereof. Accordingly, the production cost of a member for EL devices is reduced, and so is the production cost of an EL device.

In case that a member for EL devices of the present invention comprises a sheet member having a gas permeable portion covering the removing agent, the removing agent can be covered between the sheet member and the adhesion member.

In case that the gas permeable portion of a member for EL devices of the present invention is composed of a porous material of polytetrafluoroethylene (PTFE, hereafter), because of the good heat resistance of this material, the EL device can be used stably even in a heating environment.

In case that the gas permeable portion of a member for EL devices of the present invention is composed of a porous material of a polymer having a crystal structure, the polymer having the crystal structure permits an easy control of the pore size of the porous material, thereby permitting an easy control of the performance of removing the predetermined gas component within the EL device.

In case that the gas permeable portion of a member for EL devices of the present invention is composed of a porous material of a thermoplastic resin, the good processability of the thermoplastic resin permits an easy processing of the gas permeable portion.

In case that the thermoplastic resin of a member for EL devices of the present invention is a polyolefin resin, the polyolefin resin permits an easy control of the pore size of the porous material, thereby permitting an easy control of the performance of removing the predetermined gas component within the EL device. Further, the low cost of the polyolefin resin reduces the production cost of the EL device. Furthermore, such a material is easily recyclable, and hence the amount of waste can be reduced by recycling after the use.

In case that the adhesion member of a member for EL devices of the present invention has the modulus of elasticity within the range of from $1 \times 10^3$ to $1 \times 10^{10}$ Pa at 25° C., because of the sufficient flexibility, the adhesion is also sufficient within the temperature range in which the EL device is used.

In case that a member for EL devices of the present invention has the modulus of elasticity of 1 MPa or higher at 25° C., because of the sufficient rigidity of the member for EL devices, the workability during the fixing of the member for EL devices increases, which permits the automated production of the EL devices. In particular, the modulus of elasticity is preferably set to be within the range of from 1 MPa to $1 \times 10^6$ MPa for a substantial improvement of the workability. However, this upper limit of modulus of elasticity is an example and not restrictive.

From the viewpoint of handling and the like, a member for EL devices of the present invention has a thickness of 5 mm or less, preferably within the range of from 5 $\mu$m to 5 mm, more preferably within the range of from 50 $\mu$m to 3 mm. However, these lower limits of thickness are examples and not restrictive.

In an EL device using a member for EL devices of the present invention, the member for EL devices has a simple structure comprising a removing agent and an adhesion member, and hence can be easily adhered onto the inner surface of the EL device, thereby reducing the production cost of the EL device.

DESCRIPTION OF THE REFERENCE NUMBERALS

8 Removing agent
11 Adhesion member

DETAILED DESCRIPTION OF THE INVENTION

The embodiments of the present invention are described below in detail with reference to the drawings.

Figure 1:
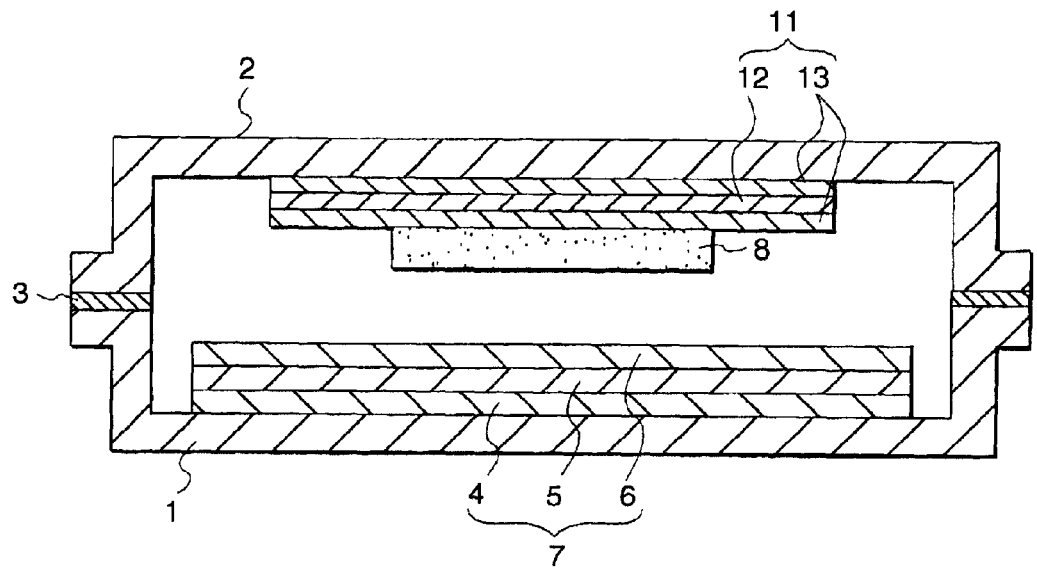
FIG. 1 is a diagram showing a first embodiment of a member for EL devices of the present invention and an EL device containing the same.

FIG. 1 shows a first embodiment of a member for EL devices of the present invention and an EL device containing the same. The EL device of the embodiment is an organic EL device, in which a front substrate 1 and a backing substrate 2 are opposed to each other and sealed with a sealant 3. On the upper surface of a dish-shaped recess of the front substrate 1, an anode 4, an organic light emitting layer 5, and a cathode 6 are sequentially superimposed to form a laminate 7. On the lower surface (inner surface) of a dish-shaped recess of the backing substrate 2, a member for EL devices is fixed for removing a predetermined gas component. The member for EL devices comprises: a plate-shaped removing agent 8 for removing a predetermined gas component; and an adhesion member 11 adhered and fixed to the removing agent 8; and is adhered to the backing substrate 2 by the adhesion member 11. Further, the adhesion member 11 is a three-layer laminate comprising a substrate layer 12 inside thereof (that is, the substrate layer 12 is sandwiched between two adhesive layers 13).

In detail, the adhesive of the adhesive layers 13 constituting the adhesion member 11 is not restricted to a specific adhesive, and may be a pressure-sensitive adhesive, a hot melt adhesive, an ultraviolet cured adhesive, a radiation cured adhesive, a heat cured adhesive, a moisture cured adhesive, a two-part adhesive, a cold-setting adhesive, or the like. When a pressure-sensitive adhesive is used, a silicone material, an acrylic material, and a rubber material are preferable.

The substrate layer 12 is composed of a substrate of a thermoplastic plastic film, a thermosetting plastic film, a metallic foil, a net, a nonwoven fabric, and the like.

The removing agent 8 is not restricted to a specific agent, and may be a compound generally used as an adsorbent, a desiccating agent (drying agent), a deoxidizing agent (oxygen absorbing agent), or the like. In particular, it is preferable for the compound of the removing agent 8 to remove at least one component selected from the group consisting of moisture, oxygen, and organic vapors. Further, the drying agent may be a compound physically adsorbing moisture or a compound chemically reacting with moisture. Such compounds includes silica gel, molecular sieves (zeolite and the like), active alumina, alkaline metal oxides, alkaline earth metal oxides, sulfates, metal halides, perchloric acid, organic compounds, carbonates, diphosphorus pentaoxide, calcium hydroxide, aluminum lithium hydroxide, active metals. In particular, silica gel adsorbing cobalt ions shows a blue color in the anhydrous state and a pink color after moisture adsorption, thereby permitting an easy determination of the state of moisture adsorption. The deoxidizing agent may be activated carbon, silica gel, molecular sieve, magnesium oxide, iron oxide, or the like. The organic-gas adsorbent may be activated carbon, silica gel, molecular sieve, or the like. Further, the removing agent 8 may be a mixed combination of a plurality of the compounds listed above.

Figure 2:
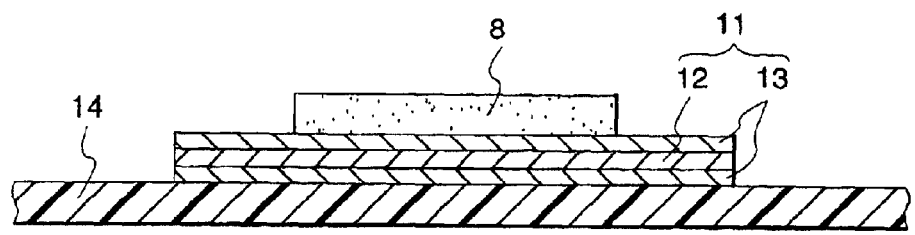
FIG. 2 is a diagram showing the method of fabricating the member for EL devices.
Figure 3:
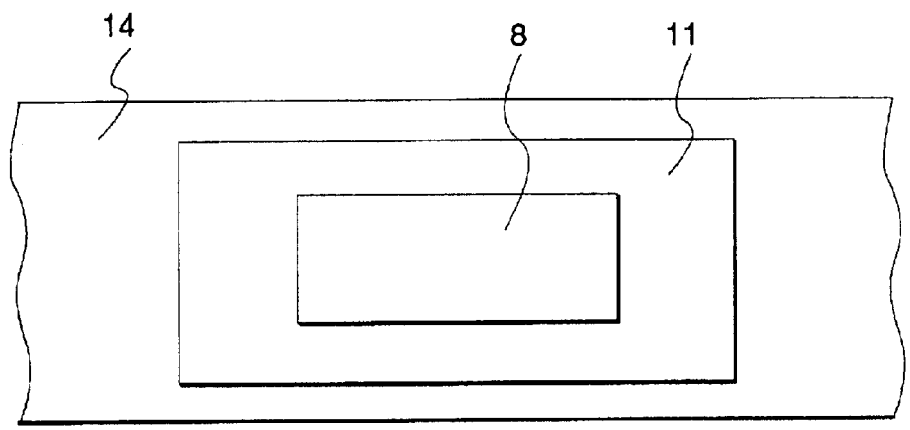
FIG. 3 is a diagram of the method of fabrication, viewed from above.

The member for EL devices is fabricated as follows and then fixed within an EL device. That is, as shown in FIGS. 2 and 3, an adhesion member 11 is sequentially formed in a predetermined shape on a long separator 14. After that, a removing agent 8 described above is adhered and fixed onto the adhesion member 11. As such, a member for EL devices is fabricated on the separator 14. Then, an automatic assembling machine picks up the member for EL devices from the separator 14, and then adheres it onto the backing substrate 2, thereby fixing it on the EL device.

As such, in accordance with the present embodiment, a member for EL devices has a simple structure comprising the removing agent 8 and the adhesion member 11, thereby permitting easy fabrication thereof. Accordingly, the production cost of the member for EL devices is reduced. Further, since the member for EL devices is fixed by a simple work of adhering, the production cost of the EL device is also reduced.

The adhesion member 11 has the substrate layer 12 inside thereof, which permits the higher modulus of elasticity of the adhesion member 11. Thus, the member for EL devices can be easily picked up from the separator 14, whereby an automatic assembling machine can be used for the picking up and the subsequent adhering onto the backing substrate 2. As such, using the members for EL devices of the present embodiment, the production of EL devices can be automated and hence speeded up, whereby the production cost of EL devices can be reduced.

Figure 4:
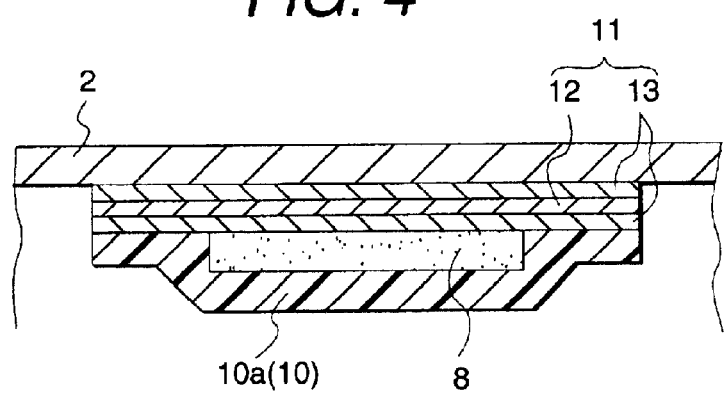
FIG. 4 is a diagram showing a second embodiment of a member for EL devices of the present invention.

FIG. 4 shows a second embodiment of a member for EL devices of the present invention. In the present embodiment, in addition to the first embodiment, a sheet member 10 comprising a gas permeable portion 10a having a gas permeability covers the removing agent 8, and is adhered to the adhesion member 11 in the periphery thereof. In the other points, the present embodiment is the same as the first embodiment. Accordingly, the same numeral is designated to an equivalent part.

In detail, the gas permeable portion 10a of the sheet member 10 is not restricted to a specific material as long as the material has a gas permeability (including a moisture permeability). However, a preferable material is a porous material of PTFE, a porous material of a polymer having a crystal structure, a porous material of a thermoplastic resin, or the like. In case that a low gas permeability is sufficient, non-porous material of these substances may be used as the gas permeable portion 10a. Further, the gas permeable portion 10a may be composed of a mixture of a plurality of the porous material substances listed above, and also may be composed of a laminate having a multi-layer structure or a combination of the porous materials listed above. The thickness and the porosity of the gas permeable portion 10a are generally from 1 to 5,000 $\mu$m and from 2 to 98%, respectively, and preferably from 3 to 4,000 $\mu$m and from 10 to 95%, respectively, but not restricted. The pore size of the gas permeable portion 10a is preferably from 0.01 to 100 $\mu$m, and particularly preferably from 0.03 to 50 $\mu$m, but not restricted as long as the pore size is sufficiently small to prevent the removing agent 8 from escaping. In particular, in case that the sheet member 10 possibly contacts to the cathode 6 of the EL device, the sheet member 10 preferably serves as a cushion. In case that the gas permeable portion 10a is composed of a porous material of PTFE, the thickness thereof is preferably 3 μm or greater, and particularly preferably from 3 to 4,000 μm, for the purpose of increasing the modulus of elasticity. The polymer having a crystal structure and the thermoplastic resin are preferably a polyolefin resin, such as polyethylene, polypropylene, polyethylene terephthalate, polybutylene terephthalate, poly-4-methylpentene-1, and poly-1-butene, or polyfluorovinylidene. These polyolefin resins may be used as a single compound or a mixture thereof. Further, the gas permeable portion 10a may be composed of a laminate of these materials.

The member for EL devices of the present invention shown in FIG. 4 is fabricated as follows and then fixed within an EL device. That is, similarly to the first embodiment, an adhesion member 11 is sequentially formed in a predetermined shape on a long separator 14. Then, a removing agent 8 is adhered and fixed onto the adhesion member 11. After that, a sheet member 10 is placed on the adhesion member 11 so as to cover the removing agent 8, and then is adhered in the periphery. As such, a plurality of members for EL devices are fabricated on the separator 14. After that, an automatic assembling machine picks up a member for EL devices from the separator 14, and then adheres it in the recess of the backing substrate 2, thereby fixing it on the EL device.

Also in the second embodiment, an operation and an effect similar to those of the first embodiment are achieved.

In the second embodiment, the sheet member 10 comprising a gas permeable portion 10a having a gas permeability is adhered onto the adhesion member 11 so as to cover the removing agent 8. Accordingly, even an unsolidified removing agent 8 can be used.

Here, the unsolidified removing agent 8 is prevented from spreading because of the covering by the sheet member 10, whereby an adverse influence of the removing agent 8 onto the EL device is suppressed.

In particular, in case that the gas permeable portion 10a is composed of the porous material of PTFE, because of the good heat resistance of this material, the EL device can be used stably even in a heating environment.

In case that the gas permeable portion 10a is composed of a porous material of the polymer having a crystal structure, the polymer having the crystal structure permits an easy control of the pore size of the porous material, thereby permitting an easy control of the performance of removing the predetermined gas component within the EL device.

In case that the gas permeable portion 10a is composed of a porous material of the thermoplastic resin, the good processability of the thermoplastic resin permits an easy processing of the gas permeable portion 10a. In particular, in case that the thermoplastic resin is a polyolefin resin, the polyolefin resin permits an easy control of the pore size of the porous material, thereby permitting an easy control of the performance of removing the predetermined gas component within the EL device. Further, the low cost of the polyolefin resin reduces the production cost of the EL device. Furthermore, such a material is easily recyclable, and hence the amount of waste can be reduced by recycling after the use.

Figure 5:
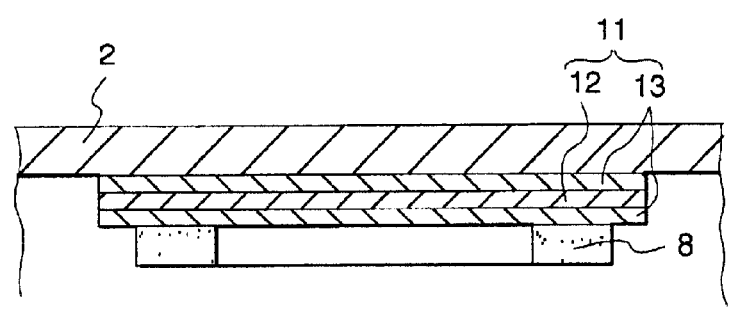
FIG. 5 is a diagram showing a third embodiment of a member for EL devices of the present invention.
Figure 6:
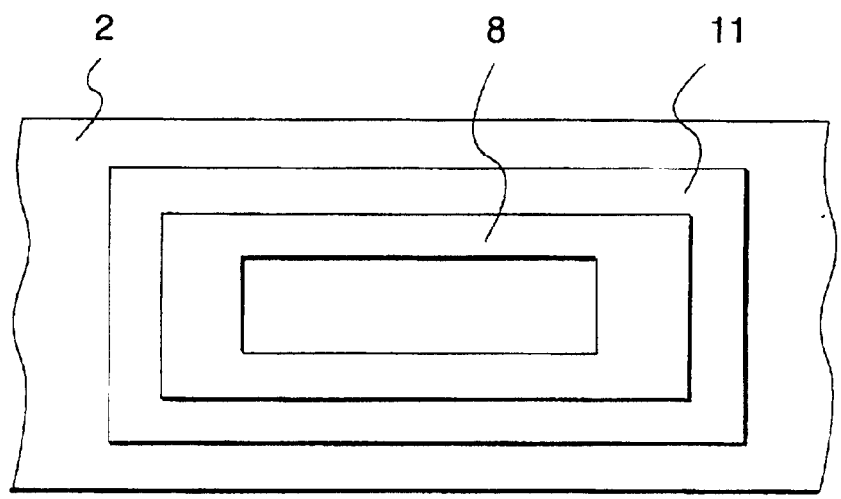
FIG. 6 is a diagram showing the third embodiment of a member for EL devices, viewed from below.

FIGS. 5 and 6 show a third embodiment of a member for EL devices of the present invention. In the present embodiment, the shape of the removing agent 8 of the first embodiment is changed to be a rectangular ring. In the other points, the present embodiment is the same as the first embodiment. Accordingly, the same numeral is designated to an equivalent part.

Also in the third embodiment, an operation and an effect similar to those of the first embodiment are achieved.

Figure 7:
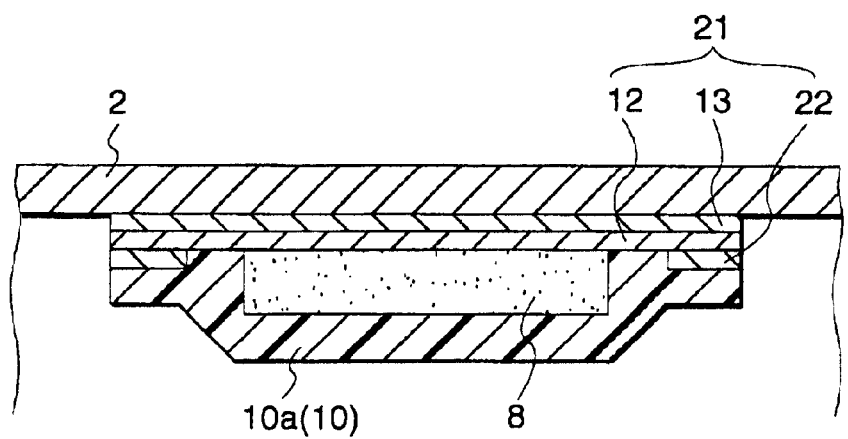
FIG. 7 is a diagram showing a fourth embodiment of a member for EL devices of the present invention.

FIG. 7 shows a fourth embodiment of a member for EL devices of the present invention. In an adhesion member 21 of the present embodiment, an adhesive layer 22 corresponding to one adhesive layer 13 adhering the sheet member 10 in the adhesion member 11 of the second embodiment is formed in the periphery of a substrate layer 12. Then, a removing agent 8 is clamped and fixed between a sheet member 10 and the substrate layer 12. In the other points, the present embodiment is the same as the second embodiment. Accordingly, the same numeral is designated to an equivalent part.

Also in the fourth embodiment, an operation and an effect similar to those of the second embodiment are achieved.

Figure 8:
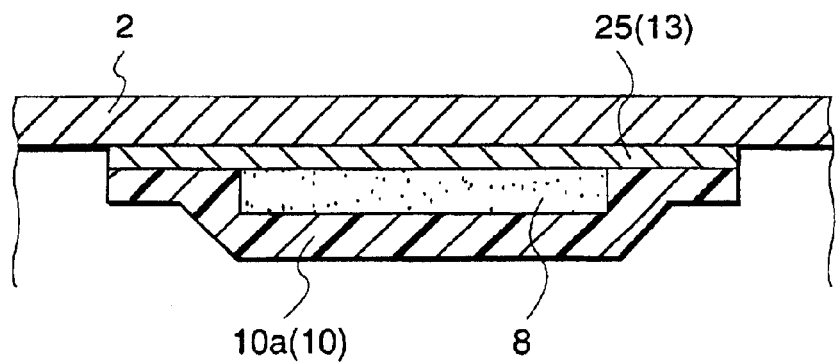
FIG. 8 is a diagram showing a fifth embodiment of a member for EL devices of the present invention.

FIG. 8 shows a fifth embodiment of a member for EL devices of the present invention. In the present embodiment, an adhesion member 25 is composed of one adhesive layer 13 of the second embodiment, without a substrate layer inside. In the other points, the present embodiment is the same as the second embodiment. Accordingly, the same numeral is designated to an equivalent part.

Figure 9:
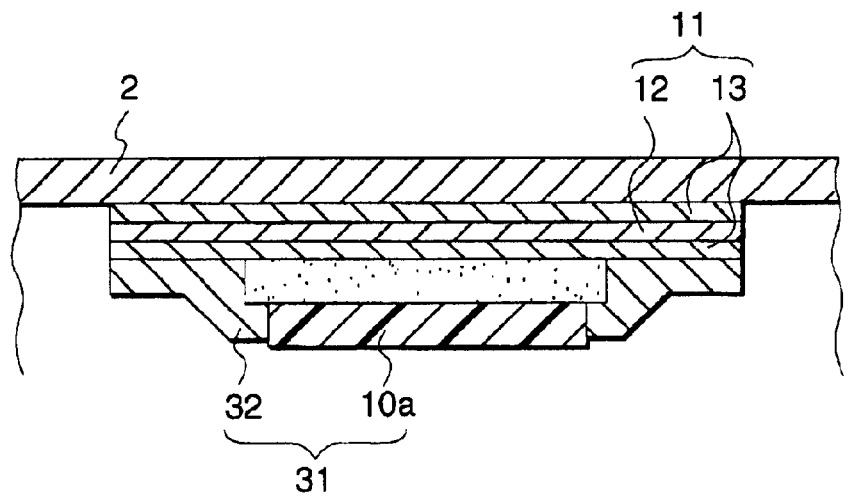
FIG. 9 is a diagram showing a sixth embodiment of a member for EL devices of the present invention.

FIG. 9 shows a sixth embodiment of a member for EL devices of the present invention. In the present embodiment, the central portion of a sheet member 31 is composed of a gas permeable portion 10a similar to that of the second embodiment, and the outside of the gas permeable portion 10a is composed of a non-porous material 32. The non-porous material 32 is composed of a plastic, a metallic film, or the like. The gas permeable portion 10a and the non-porous material 32 may be junctioned with adhesive. In case that the non-porous material 32 is composed of a thermoplastic resin or the like, thermal fusion bonding can be used for the junction. In the other points, the present embodiment is the same as the second embodiment. Accordingly, the same numeral is designated to an equivalent part.

In such a member for EL devices, the area ratio between the gas permeable portion 10a and the non-porous material 32 can be changed, whereby the strength of the sheet member and the permeability of the gas component can be controlled in a wider range than controlled by altering only the gas permeable portion 10a. The strength of the sheet member 31 can affects the improvement of the pick-up rate from the separator 14, and the control of the permeability of the gas component can affects the control of the process speed of the gas component. Further, an operation and an effect similar to those of the second embodiment are achieved.

In each above-mentioned embodiment, on the upper surface of a dish-shaped recess of the front substrate 1, an anode 4, an organic light emitting layer 5, and a cathode 6 are sequentially superimposed to form a laminate 7. However, in addition to these layers, an electron-transporting layer, a hole-transporting layer, a hole-injecting layer, and the like may be formed. Further, a plurality of these layers may be formed.

The inner space of the EL device may contain a sealed gas, and may be in vacuum.

The method of fabricating the porous material of a thermoplastic resin is not restricted to a specific method, and may be a method in which an extruded film is stretched, a method in which a resin solved in a good solvent is deposited in a poor solvent, a method in which a porous product molded by pressing a granular resin is machined to form a film, and the like.

As such, a member for EL devices of the present invention comprises: a removing agent for removing a predetermined gas component; and an adhesion member fixed to the removing agent and for adhering the removing agent onto the inner surface of an EL device. Because of this simple structure comprising a removing agent and an adhesion member, the member for EL devices permits easy fabrication thereof. Accordingly, the production cost of a member for EL devices is reduced, and so is the production cost of an EL device.

In case that a member for EL devices of the present invention comprises a sheet member having a gas permeable portion covering the removing agent, the removing agent can be covered between the sheet member and the adhesion member.

In case that the gas permeable portion of a member for EL devices of the present invention is composed of a porous material of a polymer having a crystal structure, the polymer having the crystal structure permits an easy control of the pore size of the porous material, thereby permitting an easy control of the performance of removing the predetermined gas component within the EL device. Further, in case that the gas permeable portion is composed of a porous material of a thermoplastic resin, the good processability of the thermoplastic resin permits an easy processing of the gas permeable portion. Furthermore, in case that the thermoplastic resin is a polyolefin resin, the polyolefin resin permits an easy control of the pore size of the porous material. In addition, the low cost of the polyolefin resin reduces the production cost of the EL device. Further, such a material is easily recyclable, and hence the amount of waste can be reduced by recycling after the use.

In case that the adhesion member of a member for EL devices of the present invention has the modulus of elasticity within the range of from $1 \times 10^3$ to $1 \times 10^{10}$ Pa at 25° C., because of the sufficient flexibility, the sufficient adhesion is maintained within the temperature range in which the EL device is used.

In case that a member for EL devices of the present invention has the modulus of elasticity of 1 MPa or higher at 25° C., because of the sufficient rigidity of the member for EL devices, a plurality of members for EL devices can be fabricated on a long separator, and the members for EL devices can be easily picked up from the separator without deformation. This permits the automated production of EL devices. Accordingly, the reduction of the time and the cost of the production of EL devices is achieved.

In case that a member for EL devices of the present invention has a thickness of 5 mm or less, the member for EL devices is easily handled.

In an EL device using a member for EL devices of the present invention, the member for EL devices has a simple structure comprising a removing agent and an adhesion member, and hence can be easily adhered onto the inner surface of the EL device, thereby reducing the production cost of EL devices.

While the invention has been described in detail and with reference to specific embodiments thereof, it will be apparent to one skilled in the art that various changes and modifications can be made therein without departing from the spirit and scope thereof.

What is claimed is:

1. A member for an electroluminescent device, comprising: a removing agent for removing a predetermined gas component; an adhesion member fixed to the removing agent wherein the adhesion member is a three-layer laminate comprising a substrate layer sandwiched between two adhesive layers; and a sheet member having a gas permeable portion covering said removing agent.

2. The member for an electroluminescent device as claimed in claim 1, wherein said gas permeable portion is composed of a porous material of polytetrafluoroethylene.

3. The member for an electroluminescent device as claimed in claim 1, wherein said gas permeable portion is composed of a porous material of a polymer having a crystal structure.

4. The member for an electroluminescent device as claimed in claim 1, wherein said gas permeable portion is composed of a porous material of a thermoplastic resin.

5. The member for an electroluminescent device as claimed in claim 4, wherein said thermoplastic resin is a polyolefin resin.

6. The member for an electroluminescent device as claimed in claim 1, wherein said adhesion member has a modulus of elasticity within the range of from $1 \times 10^3$ to $1 \times 10^{10}$ Pa at 25° C.

7. The member for an electroluminescent device as claimed in claim 1, wherein said member for an electroluminescent device has a modulus of elasticity within the range of from 1 MPa to $1 \times 10^6$ MPa at 25° C.

8. The member for an electroluminescent device as claimed in claim 1, wherein the thickness of said member for an electroluminescent device is 5 mm or less.

9. An electroluminescent device containing a member for an electroluminescent device comprising a removing agent for removing a predetermined gas component, an adhesion member fixed to the removing agent wherein the adhesion member is a three-layer laminate comprising a substrate layer sandwiched between two adhesive layers, and a sheet member having a gas permeable portion covering said removing agent.

* * * * *